United States Patent [19]
Yamaguchi

[11] Patent Number: 5,736,953
[45] Date of Patent: Apr. 7, 1998

[54] A/D CONVERTER HAVING A REDUCED RESPONSE TIME AND REDUCED POWER CONSUMPTION

[75] Inventor: Motoi Yamaguchi, Tokyo, Japan

[73] Assignee: NEC Corporation, Tokyo, Japan

[21] Appl. No.: 616,353

[22] Filed: Mar. 15, 1996

[30] Foreign Application Priority Data

Mar. 17, 1995 [JP] Japan .................. 7-086130

[51] Int. Cl.$^6$ .................................. H03M 1/40
[52] U.S. Cl. .................. 341/163; 341/156; 341/164; 341/165
[58] Field of Search .................. 341/163, 156, 341/164, 165

[56] References Cited

U.S. PATENT DOCUMENTS

| | | | |
|---|---|---|---|
| 3,937,897 | 2/1976 | Song | 179/15 |
| 4,097,753 | 6/1978 | Cook et al. | 307/359 |
| 5,122,800 | 6/1992 | Philipp | 341/156 |
| 5,543,795 | 8/1996 | Fernald | 341/163 |

OTHER PUBLICATIONS

High–Accuracy A/D Converters, Chapter 7.5, pp. 280–287.

*Primary Examiner*—Jeffrey A. Gaffin
*Assistant Examiner*—Jason H. Vick
*Attorney, Agent, or Firm*—Sughrue, Mion, Zinn, Macpeak & Seas, PLLC

[57] ABSTRACT

An A/D converter includes a three-state comparator for detecting a higher state, a lower state and a equal state of a sampled analog signal with respect to a sequence of reference signals which are supplied from a counter or register after D/A conversion. After the equal state is detected, the D/A converter and the three-state comparator are stopped for power saving. The A/D converter further includes a frame memory and a control section which provide the counter or register with an initial code for each conversion cycle based on the last code of the previous conversion cycle constituting the previous digital output of the A/D converter. The A/D converter well follows the sequential change of the input level between the conversion cycles.

18 Claims, 11 Drawing Sheets

A/D CONVERTER HAVING A REDUCED RESPONSE TIME AND REDUCED POWER CONSUMPTION

BACKGROUND OF THE INVENTION (a) Field of the Invention

The present invention relates to an A/D converter and, more particularly, to an A/D converter especially suited for power saving and/or quick response.

(b) Description of the Related Art

FIG. 1 shows an example of a prior art A/D converter called a tracking A/D converter. The tracking A/D converter includes a sample-and-hold circuit 72, a comparator 73, an up-down counter 75, and a D/A converter 76. The sample-and-hold circuit 72 holds an input analog signal having a potential Vin and supplied through an analog input terminal 71 during an A/D conversion cycle. The comparator 73 compares the input Vsh supplied from the sample-and-hold circuit 72 with the output Vda of the D/A converter 76 so as to generate a high level or a low level signal in accordance with the result of the comparison. The up-down counter 75 increases or decreases its count in increments of one by one in accordance with the output of the comparator 73 to thereby output a digital code corresponding to the count thereof. The D/A converter 76 converts or translates the digital code into an analog signal.

Referring to FIG. 2A, in the prior art tracking A/D converter as described above, since the count of the up-down counter 75 is incremented or decremented one at a time, if the level of the input analog signal, i.e., the input Vsh of the comparator 73 changes significantly between two conversion cycles, the output of the A/D converter has difficulty following that analog input signal to provide a quick response.

In addition, the comparator 73 can only judge which input is greater than the other, therefore, the digital code output from the up-down counter 75 sometimes does not converge in the conversion cycle even when it resides in a stable state, as shown in FIG. 2B. In this case, the up-down counter 75 periodically changes in its least significant bit (LSB). Thus, both the up-down counter 75 and the D/A converter 76 periodically operate during the conversion cycle.

In short, the prior art tracking A/D converter as described above has a drawback in that if the level of the input signal is dynamically changed, the output digital code has difficulty following the input signal. In addition, the count of the up-down counter is repeatedly incremented and decremented in accordance with the result of the comparison to consume a large amount of electric power.

FIG. 3 shows an example of another prior art A/D converter called a successive approximation A/D converter. The successive approximation A/D converter includes a sample-and-hold circuit 92, a comparator 93, a control circuit 94, a successive approximation register 95, and a D/A converter 96.

The sample-and-hold circuit 92 holds an input analog signal having a potential Vin and supplied through an analog input terminal 91 during an A/D conversion cycle. The comparator 93 compares the input Vsh supplied from the sample-and-hold circuit 92 with the output Vda of the D/A converter 96 so as to output a high level or a low level signal in accordance with the result of the comparison. The control circuit 94 rewrites the digital code, which is stored in the successive approximation register 95, in sequence beginning with the most significant bit (MSB) toward the LSB of the register 95, on the basis of the result of the comparison in the comparator 93. The D/A converter 96 converts the digital code output from the successive approximation register 95 into an analog signal.

In the prior art successive approximation A/D converter as described above, since the successive approximation register 95 is reset at the beginning of each conversion cycle, both the D/A conversion and the comparison must be carried out N times during every conversion cycle in order to output an N-bit digital code even if the level of the input signal is not changed, thereby consuming a large amount of electric power.

SUMMARY OF THE INVENTION

In view of the foregoing, it is an object of the present invention to provide an A/D converter which can operate in a low power consumption and/or has a quick response.

The present invention, in a first aspect thereof, provides an A/I) converter comprising a sample-and-hold circuit for sampling-and-holding an analog input signal to generate a first signal for each conversion cycle, a comparator for periodically comparing the first signal with a sequence of second signals to thereby general a sequence of result signals, a code generator for outputting a sequence of digital codes dependent on corresponding one of the result signals, the digital codes including at least an initial code and a final code during each conversion cycle, a D/A converter for periodically converting the sequence of digital codes into a corresponding sequence of analog signals, the D/A converter supplying the corresponding sequence of analog signals as the sequence of second signals, an output section for outputting the final code of each conversion cycle as a final output of the A/D converter, a memory section for storing therein the final code for each conversion cycle, and a control section for supplying the initial code to the code generator based on the last code of at least one previous conversion cycle stored in the memory section.

In the tracking A/D converter according to the first aspect of the the present invention, since the last digital code of the previous conversion cycle is supplied to the code generator as an initial code thereof, the possible difference between the initial value and the last value of the code generator in each conversion cycle can be decreased, thereby allowing the digital output to quickly follow an input analog signal.

The present invention also provides, in a second aspect thereof, an A/D converter comprising a sample-and-hold circuit for sampling-and-holding an analog input signal to generate a first signal for each conversion cycle, a comparator for periodically comparing the first signal with a sequence of second signals to thereby generate a sequence of result signals, each of the result signals including one of a higher state, a lower state and an equal state of the first signal with respect to a corresponding one of the second signals, a code generator for outputting a sequence of digital codes dependent on corresponding one of the result signals, the digital codes including at least an initial code and a final code during each conversion cycle, the code generator holding a previous digital code during each conversion cycle after the equal state is generated, a D/A converter for periodically converting the sequence of digital codes into a corresponding sequence of analog signals, the D/A converter supplying the corresponding sequence of analog signals as the sequence of second signals, an output section for outputting the final code of each conversion cycle as a final output of the A/D converter.

In the A/D converter in the second aspect of the present invention, since the comparator is provided with the function of judging equal state of an analog input with the output of the D/A converter, the operation of both the up-down counter and the D/A converter can be stopped after generation of the equal state of the input analog signal with respect to the digital signal. Therefore, electrical power consumption can be reduced.

It is preferable that A/D converter according to the first aspect of the present invention has a frame memory. If the input signal of the A/D converter is an image signal, each frame of the image signal will consist of a static image component and a dynamic image component, and it is considered that the static image component is generally repeated periodically with a period corresponding to a single frame. The frame memory preferably stores a sequence of the last codes in one frame of the image data, i.e., the outputs of the A/D converter for one frame of the image data. The last code at the time one frame prior to the current conversion cycle is read out from the frame memory for the current conversion, and the read out digital code is supplied to the code generator as an initial code for the current conversion cycle, which in turn is supplied to the D/A converter. Alternatively, data which has been obtained by processing or calculating based on the read out digital code can be supplied as an initial code or an expected value to the code generator.

If the image signal consists of a static image, it is expected that the image signal approximately coincides with the corresponding last signal or a value estimated therefrom. Therefore, the number of times of operation of the D/A converter receiving the output of code generator is reduced relative to the prior art. On the other hand, if the image signal contains a dynamic image component, suitable data processing can be executed from the last code to generate an estimated value for the input signal, which can possibly reduce the number of times of operation of the D/A conversion. In particular, if an analog input coincides with the output of the D/A converter in a first operation or after a few operations, operation of the code generator can be stopped and the digital code is held constant during the rest of the conversion cycle. Therefore, electrical power consumption can be largely reduced.

A tracking A/D converter in an embodiment of the present invention may be designed such that an expected value for the input analog signal is supplied to an up-down counter as an initial value, the output digital code follows the input analog signal with a reduced delay time. In addition, the A/D converter includes a three-state comparator which can judge the three states of the input with respect to the digital code, including "higher state", "lower state" and "equal state" of the input signal with respect to the digital code. As a consequence, after the circuit operation reaches a stable state because the three-state comparator outputs a signal of equal state or "coincidence", the operation of both the counter and the D/A converter can be stopped, and hence average power consumption can be reduced.

A successive approximation A/D converter in another embodiment of the present invention may be designed such that an expected code is supplied to a successive approximation converter as an initial code. If the initial code coincides with an analog input signal, the operation of both the successive approximation register and the D/A converter can be stopped. Therefore, electrical power consumption is reduced. Even if the initial code does not coincide with the input analog signal, the difference between the expected value and the input analog signal is possibly small.

Therefore, the numbers of operations and average power consumption can be reduced.

Other and further objects, features and advantages of the present invention will be more apparent from the following description of preferred embodiments of the invention with reference to accompanying drawings.

DESCRIPTION OF THE PREFERRED EMBODIMENTS

Before describing embodiments of the present invention, disadvantages of the prior art successive approximation A/D converter as described above will be detailed for the sake of understanding of the present invention.

Figure 1:
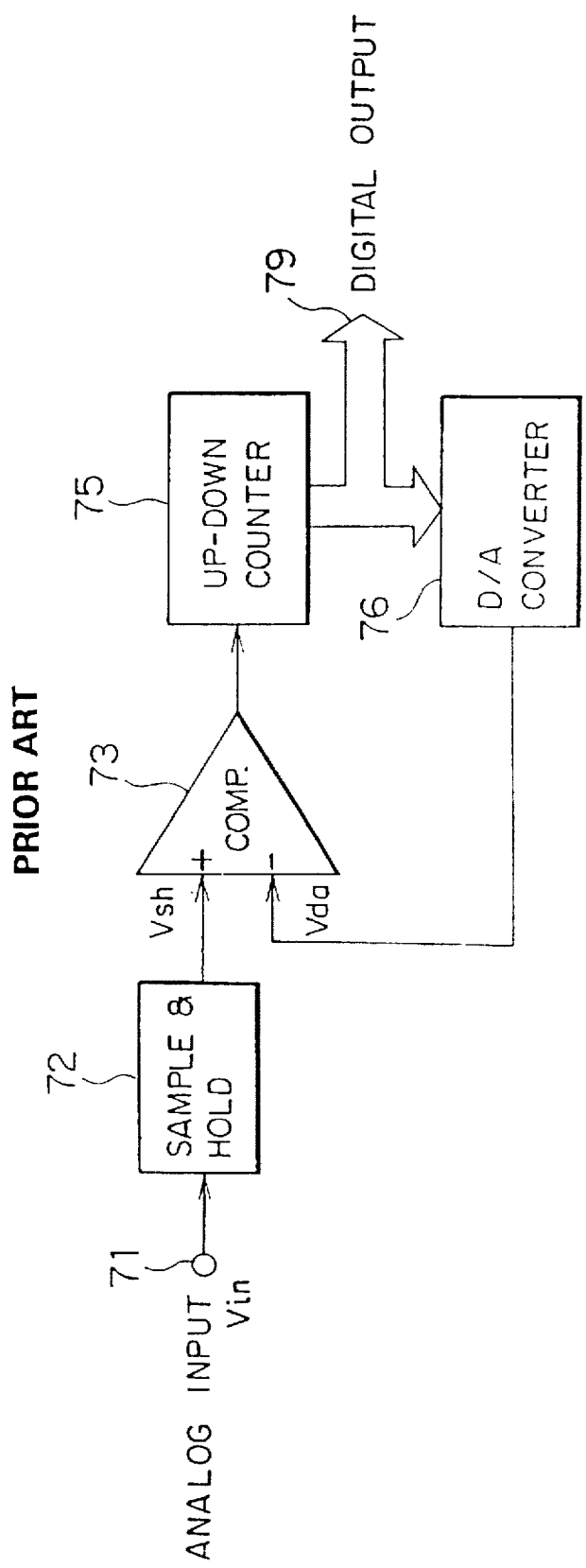
FIG. 1 is a block diagram of a prior art tracking A/D converter.
Figure 2A:
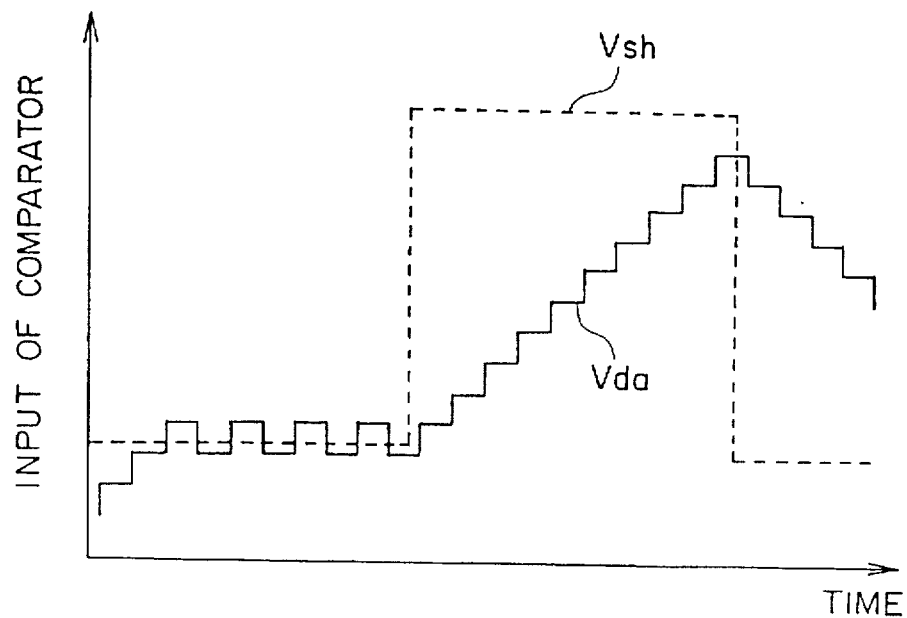
FIGS. 2A and 2B are time chart and a diagram, respectively, for operation of the prior art tracking A/D converter of FIG. 1.
Figure 2B:
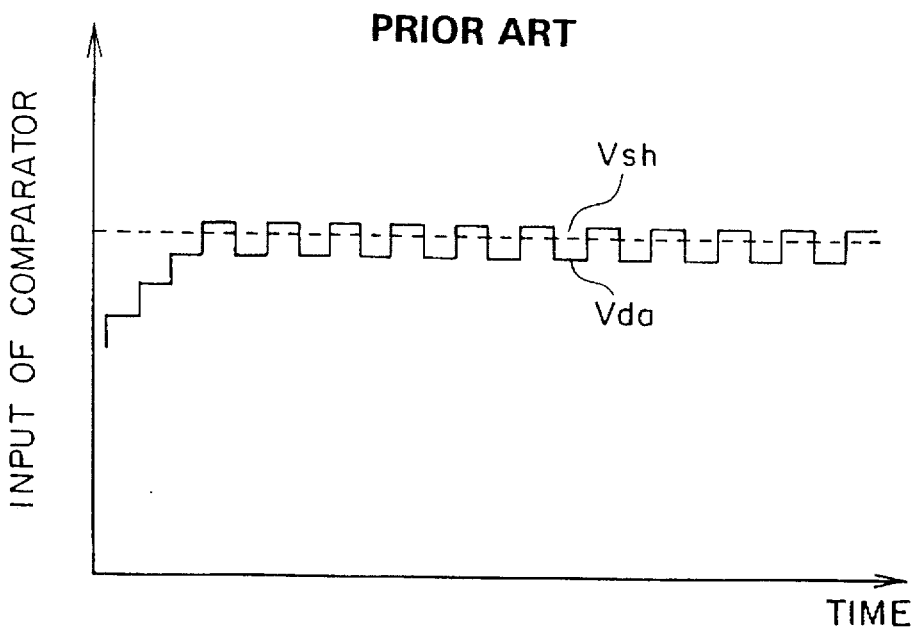
Figure 3:
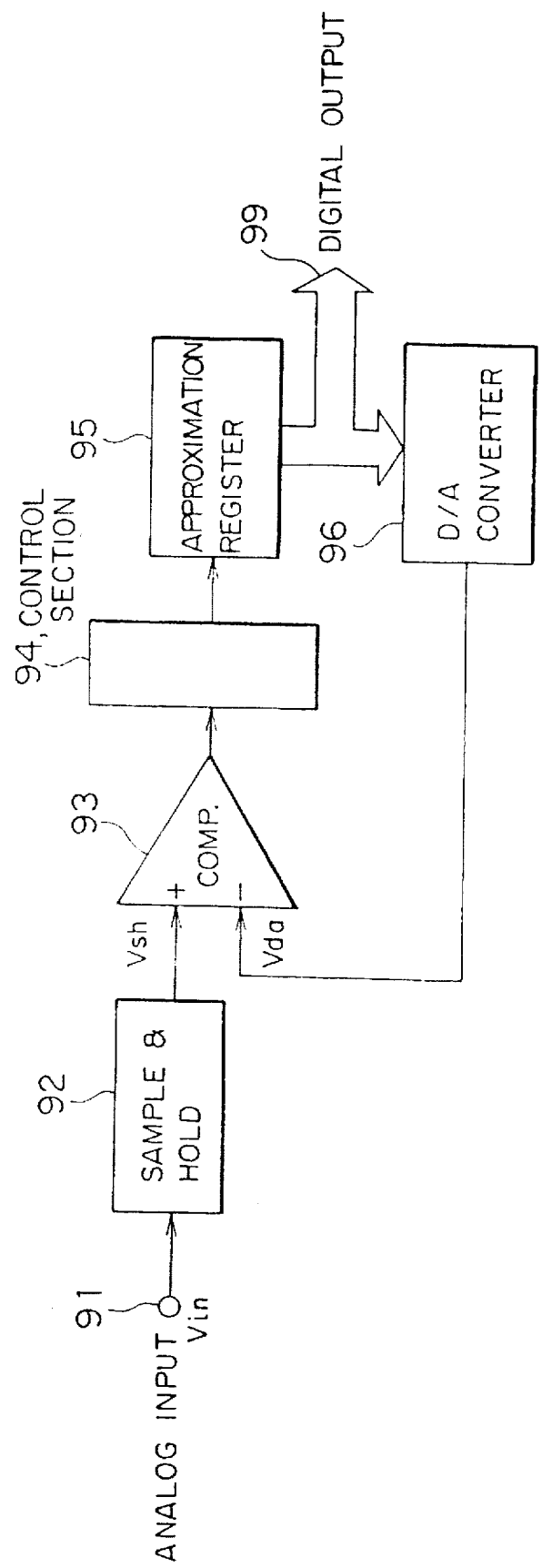
FIG. 3 is a block diagram of a prior art successive approximation A/D converter.

In the prior art successive approximation A/D converter of FIG. 3, the successive approximation register 95 is reset at the beginning of each A/D conversion cycle. Hence, irrespective of the level of the input signal, D/A conversion and comparison must be repeated N times in order to convert the input analog signal into an N-bit digital code.

Figure 4A:
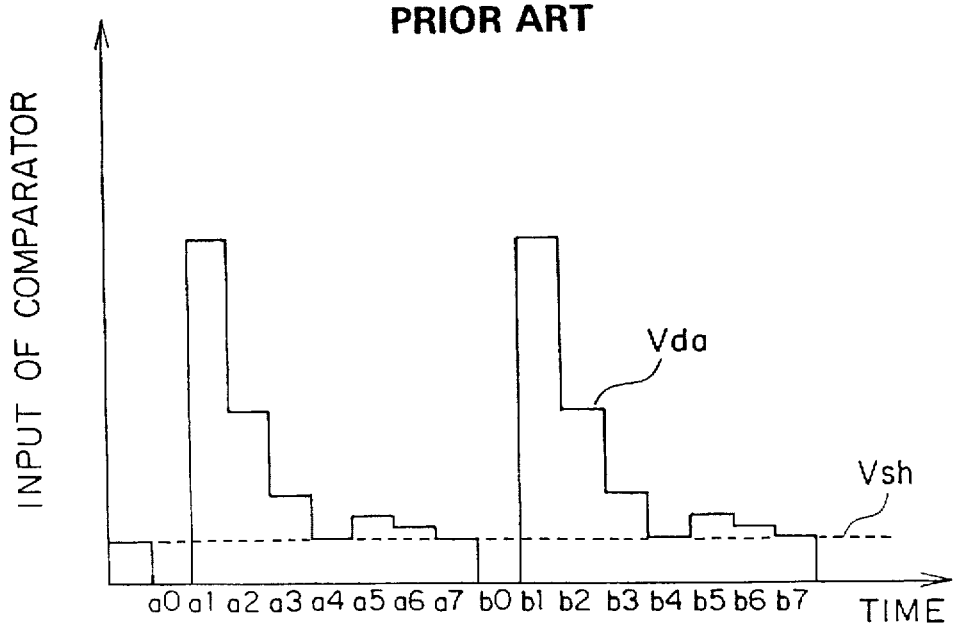
FIGS. 4A and 4B are a time chart and a diagram, respectively, for operation of the prior art successive approximation A/D converter of FIG. 3.
Figure 4B:
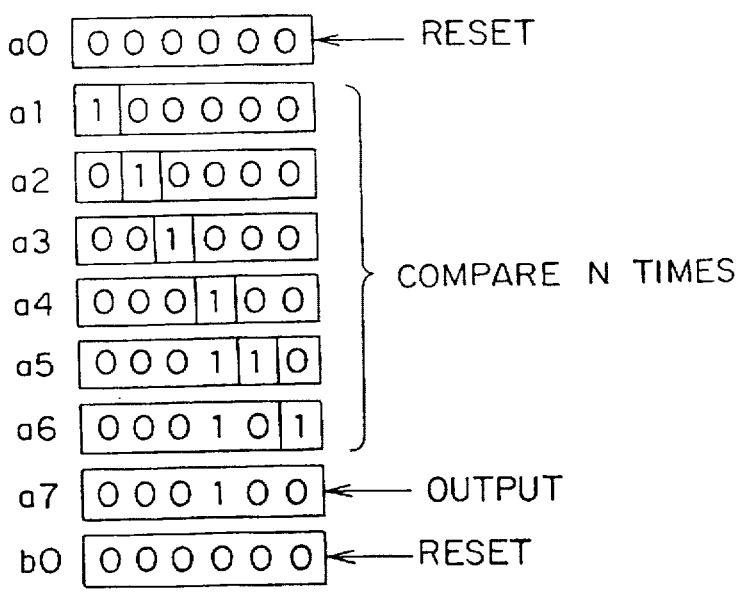

FIGS. 4A and 4B show the conversion process by the successive approximation A/D converter when the digital output 99 thereof has 6 bits, wherein a0 to a7 and b0 to b7 represent respective conversion cycles. The level of the output Vsh of the sample-and-hold circuit 92 (the input of the comparator 93) is represented by a broken line. At time a0, the successive approximation register 95 is reset to have a digital code "000000". Then, at time a1, the MSB of the successive approximation register 95 is set to "1", and the output Vsh of the sample-and-hold circuit 92 is compared with the output Vda of the D/A converter 96 corresponding to the digital code output from the successive approximation register 95.

After the comparator 93 detects that the level of the output Vsh is lower than that of the output Vda, the MSB of the successive approximation register 95 and the bit next to the MSB are rewritten to "0" and "1" at time a2, respectively, and the resultant data are transmitted to the D/A converter 96. Then, the input Vsh is compared with the level of the output signal Vda of the D/A converter 96 corresponding to "010000". The sequence of "rewriting of the register data", "D/A conversion" and "comparison" is repeated until time a7 at which the final digital code "000100" is determined.

In the conventional successive approximation A/D converter, the successive approximation register 95 is reset to rewrite the digital code stored in the successive approximation register 95 at the beginning of every conversion cycle even when the level of the input analog signal is not changed. As a result, the D/A converter 96 must operate six times a1 to a6 or b1 to b6 during each conversion cycle. That is, as will be understood from FIG. 4A, although the potential of the input analog signal is not changed after b0, and accordingly the level of the output signal Vsh of the sample-and-hold circuit 92 is the same as that during the last conversion cycle, the successive approximation processing is carried out for each conversion cycle from b1 to b6 after the successive approximation register 95 has been reset at time b0.

The present invention is devised for solving the disadvantages in the conventional A/D converters as described above.

Figure 5:
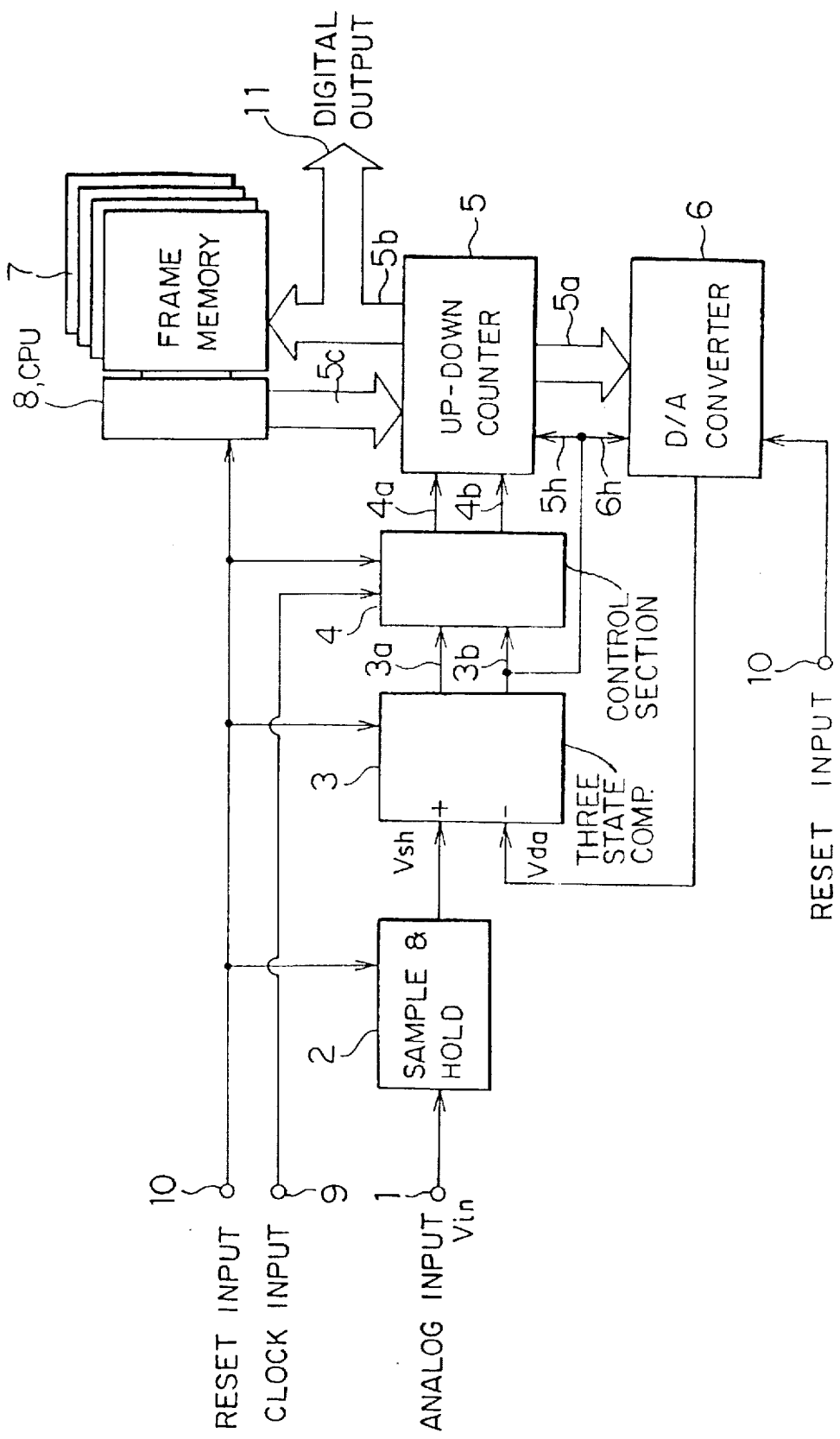
FIG. 5 is a block diagram of a tracking A/D converter according to a first embodiment of the present invention.

Now, embodiments of the present invention will be described in detail with reference to the drawings.
Embodiment 1:

FIG. 5 shows a tracking A/D converter as an A/D converter according to a first embodiment of the present invention.

In FIG. 5, an analog input terminal 1 of the A/D converter is connected to the input of a sample-and-hold circuit 2. The output of the sample-and-hold circuit 2 is connected to the first input or signal input (+) of a three-state comparator 3 for judging three states (namely, higher state, lower state and coincidence) of the input signal with respect to the reference signal for the three-state comparator. The output terminal of a D/A converter 6 is connected to the second input (−) of the three-state comparator 3 receiving the reference signal.

The first output 3a of the three-state comparator 3 for indicating higher and lower states of the input signal, the second output 3b of the three-state comparator 3 for indicating coincidence of the input signal, and a clock signal terminal 9 are connected to a control circuit 4.

The second output 3b of the three-state comparator 3 is also connected to the hold input 5h of an up-down counter 5 and the hold input 6h of the A/D converter 6.

The internal digital output 5a of the up-down counter 5 is connected to the digital input of the D/A converter 6 so as to supply the count of the up-down counter 5 to the D/A converter 6. The external digital output 5b of the up-down counter 5 is connected to the input of a frame memory 7 and an external output terminal 11 of the A/D converter.

Connected to the frame memory 7 is a digital computer (CPU) 8 for calculating an expected code for the input signal on the basis of prior data. The output of the digital computer 8 is connected to the initial code input 5c of the up-down counter 5.

A reset input terminal 10 of the A/D converter is connected to the sample-and-hold circuit 2, the three-state comparator 3, the control circuit 4, the up-down counter 5, the D/A converter 6 and the digital computer 8.

The sample-and-hold circuit 2 samples an input potential Vin at the analog input terminal 1 during a reset period at which the reset input terminal 10 is maintained at an active level, i.e., a high level, then holds the sampled analog signal during a conversion period at which the reset input terminal 10 is maintained at an inactive level, i.e., a low level.

The three-state comparator 3 compares the level of the input Vsh (or sampled Via) with the level of the output Vda of the D/A converter 6. Thus, the comparator 3 outputs a signal of a high level from the first output 3a if the level of the input Vsh is higher than that of the signal Vda, and outputs a signal of a low level from the first output 3a if the level of the input Vsh is lower than that of the signal Vda. The comparator 3 also outputs a signal of a high level from the second output 3b if the level of the input Vsh coincides with the level of the output Vda of the D/A converter, or more specifically, if the difference in level between the signal Vsh and the signal Vda is below a predetermined level.

The control circuit 4 supplies through the count-up output 4a thereof a signal of an active level (high level) when the first output 3a of the three-state comparator 3 is at a high level, and supplies through the count-down output 4b thereof a signal of an active level (high level) when the first output 3a of the three-state comparator 3 is at a low level. The control circuit 4 outputs these signals synchronously with a reference clock CLK input through the clock input terminal 9 of the A/D converter.

Once the level at the second output 3b of the three-state comparator 3 becomes high, both the count-up output 4a and the count-down output 4b are maintained at an inactive level (at a low level), irrespective of the level of the potential at the first output 3a, until the next reset signal is input through the reset input terminal 10.

The up-down counter 5 first fetches therein an expected value for the input signal, as an initial code for each conversion cycle, which is output from the digital computer 8 during a reset period, and increases or decreases the digital code in increments of one by one during a conversion period in accordance with the count-up signal and the count-down signal output from the control circuit 4. The up-down counter 5 outputs the count thereof to the D/A converter 6 through the internal digital output 5a thereof.

The up-down counter 5 counts forward to increase the digital code thereof by one when the count-up output 4a of the control circuit 4 is at an active level and counts reverse to decrement the digital code thereof by one when the count-down output 4b of the control circuit 4 is at an active level. The up-down counter 5 maintains the digital code if both the output terminals 4a and 4b are at an inactive level, i.e., a low level.

When the second output 3b of the three-state comparator 3 is at an active level, the up-down counter 5 stops the counting operation and outputs the current digital code to both the frame memory 7 and the external output terminal 11 through the external digital output 5b of the up-down counter 5.

Figure 9:
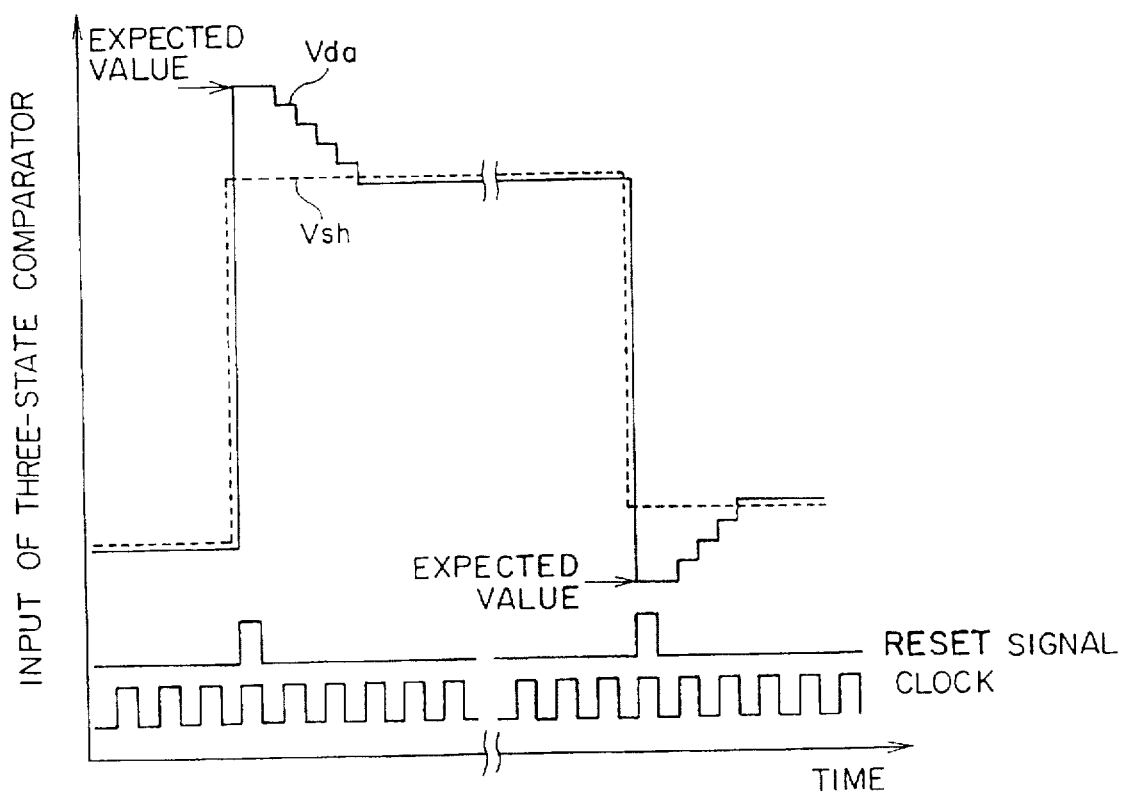
FIG. 9 is a time chart for operation of the tracking A/D converter of FIG. 5.

Referring now to FIG. 9 showing operation of the A/D converter of FIG. 5, the initial level of the output Vda of the D/A converter 6 corresponding to the digital code of the expected value for the input analog signal is higher than that of the sampled analog signal Vsh in this example. Thus, the up-down counter 5 decreases its count in increments of one by one with the clock pulses, and stops its counting operation after the level of the output Vda of the D/A counter 6 is substantially equal to the level of the sampled analog signal Vsh.

The D/A converter 6 converts the digital code of the up-down counter 5 into an analog signal and supplies the analog signal back to the second input or reference input (−) of the three-state comparator 3. Then, the D/A converter 6 receives the signal output from the second output 3b of the three-state comparator 3 through the input 6h thereof, and when the second output 3b becomes an active level, the D/A converter 6 stops its operation until the next reset signal is supplied.

The frame memory 7 stores digital codes output from the external digital output 5b of the up-down counter 5. The digital computer 8 calculates an expected (estimated) value for the next input analog signal on the basis of the digital codes stored in the frame memory 7 and outputs the expected value to the up-down counter 5, as the initial code 5c therefor.

Figure 6:
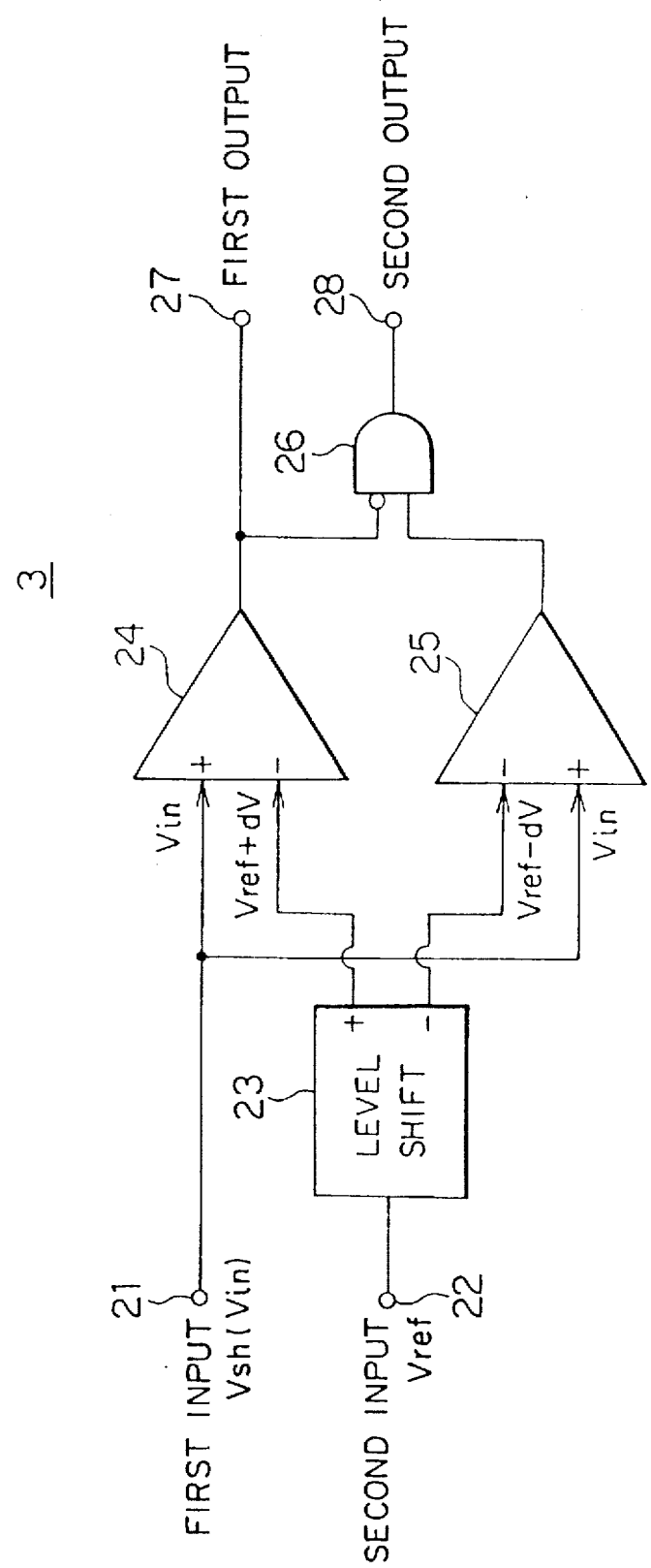
FIG. 6 is a circuit diagram of the three-state comparator shown in FIG. 5.

Referring to FIG. 6, the three-state comparator 3 includes two ordinary comparators including first and second comparators 24 and 25, and further includes a level shift circuit 23 and an AND gate 26. The first input 21 of the three-state comparator 3 is connected to the signal input (+) of the first comparator 24 and the signal input (+) of the second comparator 25, and the second input 22 of the three-state comparator is connected to the input of the level shift circuit 23, which has a higher voltage output (+) and a lower voltage output (−).

The higher voltage output (+) of the level shift circuit 23 is connected to the reference input (−) of the first comparator 24, and the lower voltage output (−) of the level shift circuit 23 is connected to the reference input (−) of the second comparator 25.

The output of the first comparator 24 constitutes the first output 27 of the three-state comparator 3 and is connected to the first input of the AND gate 26 after it is inverted. The output of the second comparator 25 is connected to the second input of the AND gate 26. The output of the AND gate 26 constitutes the second output of the three-state comparator 3.

The first comparator 24 compares the potential at the signal input (+) thereof with the potential at the reference input (−) thereof, and outputs a signal of a high level to the output thereof when the potential at the signal input(+) is higher than that at the reference input (−). The first comparator 24 also outputs a signal of a low level when the potential at the signal input (+) thereof is lower than that at the reference input (−) thereof. The second comparator 25 operates in a similar manner to that in the first comparator 24.

When a reference signal Vref is supplied to the input of the level shift circuit 23, the level shift circuit 23 outputs a signal having a higher voltage of (Vref+dV) to the reference input (−) of the first comparator 24 and a signal of a lower voltage of (Vref−dV) to the reference input (−) of the second comparator 25. The AND gate 26 outputs a high level when the potential of the output of the first comparator 24 is low and the potential of the output of the second comparator 25 is high.

With the configuration as described above, if the potential Vin (Vsh) of the input of the three-state comparator 3 is higher than (Vref+dV), the potential at the first output 27 is high, while if the potential Vin of the input is lower than (Vref−dV), the potential at the first output 27 is low. If the potential Vin of the input signal is between (Vref−dV) and (Vref+dV), irrespective whether the input is higher or lower than Vin and whether the first output is high or low, the potential at the second output 28 is high. That is, the three-state comparator 3 has a function of a window comparator additionally to the function of an ordinary comparator, and outputs three states of the input with respect to the reference input including higher state, lower state and coincidence of the input thereof with respect to a reference signal.

Figure 7:
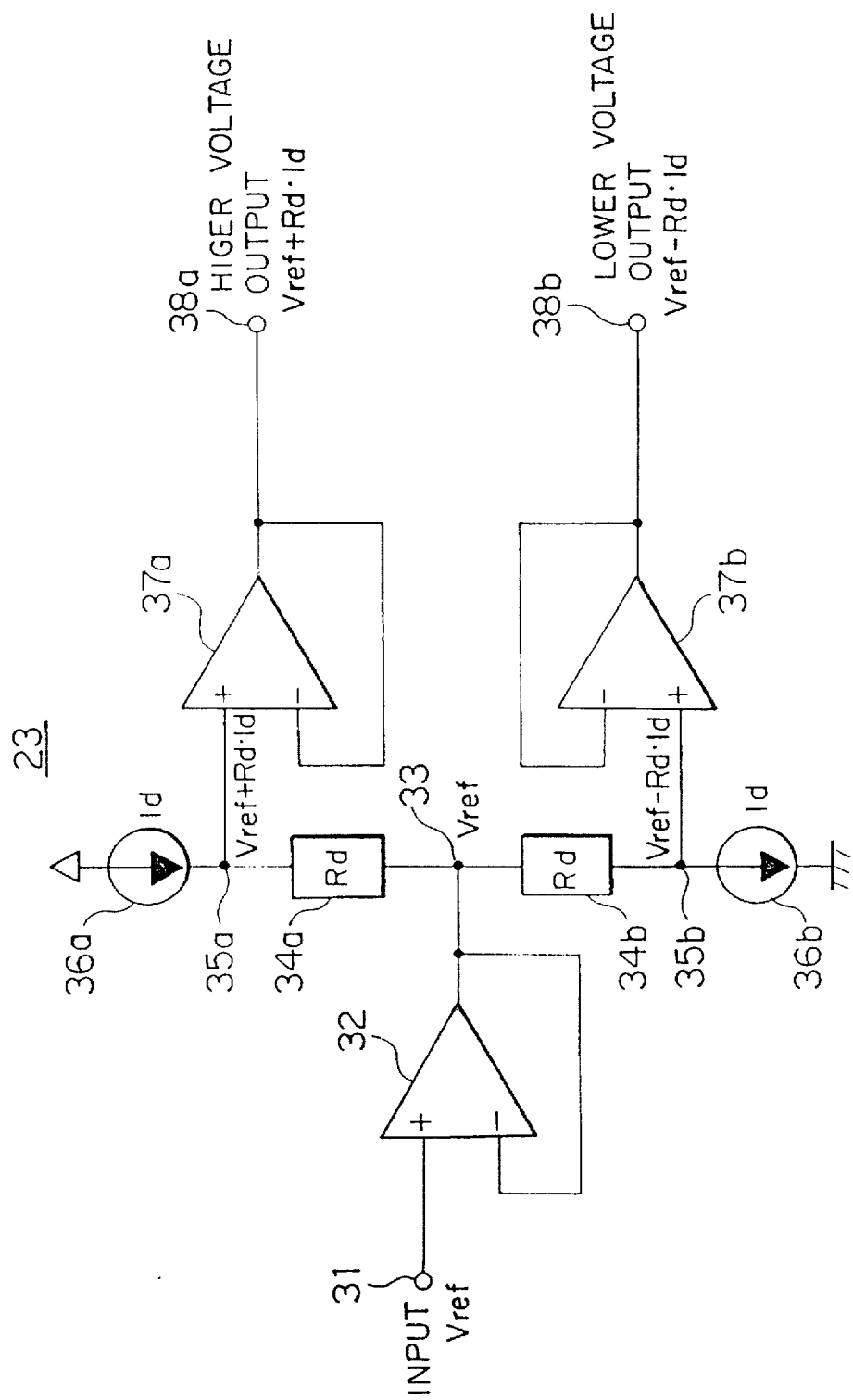
FIG. 7 is a circuit diagram of the level shift circuit shown in FIG. 6.

Referring to FIG. 7, there is shown an example of the level shift circuit 23 in the three-state comparator 3 of FIG. 6. The input 31 of the level shift circuit 23 is connected to the non-inverting input (+) of a first operational amplifier 32.

The output of the first operational amplifier 32 is connected to the inverting input thereof (−) and a node 33.

First ends of first and second resistors 34a and 34b both having resistance Rd are connected with each other at node 33, and second ends of the first and second resistors 34a and 34b are connected to nodes 35a and 35b, respectively.

A first current source 36a is connected between the node 35a and a power source so as to receive constant current Id therefrom, and a second current source 36b is connected between the node 35b and the ground so as to discharge the constant current Id thereto. Node 35a is connected to the non-inverting input (+) of a second operational amplifier 37a while node 35b is connected to the non-inverting input (+) of a third operational amplifier 37b. The output of the second operational amplifier 37a constitutes the higher voltage output 38a of the level shift circuit 23 for supplying a voltage of (Vref+Rd·Id) while the output of the third operational amplifier 37b constitutes the lower voltage output 38b of the level shift circuit 23 for supplying a voltage of (Vref−Rd·Id).

Figure 8:
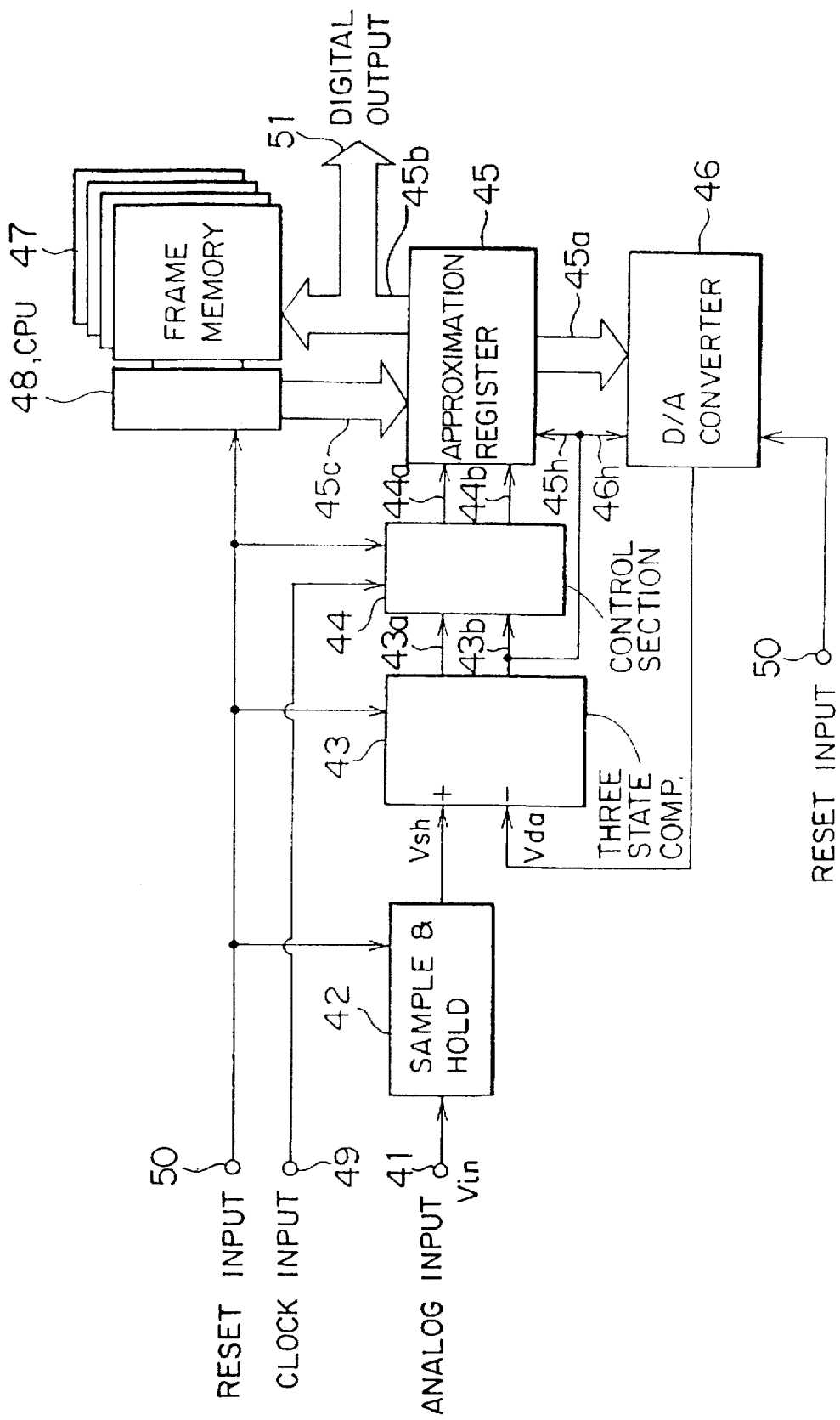
FIG. 8 is a block diagram of a successive approximation A/D converter according to a second embodiment of the present invention.

Embodiment 2:

FIG. 8 shows a successive approximation A/D converter as an A/D converter according to a second embodiment of the present invention.

In FIG. 8, an analog input terminal 41 is connected to the input of a sample-and-hold circuit 42. The output of the sample-and-hold circuit 42 is connected to the first input (+) of a three-state comparator 43 for judging one of three states (higher state, lower state and coincidence). The output of a D/A converter 46 is connected to the second input (−) of the three-state comparator 43.

The first output 43a and the second output 43b of the three-state comparator 43, and clock signal terminal 49 are connected to a control circuit 44. The register control output 44a of a control circuit 44 is connected to a successive approximation register 45. The second output 43b of the three-state comparator 43 is also connected to the hold inputs 45h and 46h of the successive approximation register 45 and the D/A converter 46.

The internal digital output 45a of the successive approximation register 45 is connected to the digital input of the D/A converter 46, and the external digital output 45b of the successive approximation register 45 is connected to the input of a frame memory 47 and the external output terminal 51 of the successive approximation A/D converter.

The frame memory 47 is connected to a digital computer 48 for calculating an expected value for the next input analog signal on the basis of prior data. The output of the digital computer 48 is connected to the initial code input 45c of the successive approximation register 45.

A reset signal input 50 is connected to each of the reset terminals of the sample-and-hold circuit 42, the three-state comparator 43, the control circuit 44, the successive approximation register 45, the D/A converter 46 and the digital computer 48.

The sample-and-hold circuit 42 samples the potential Via at the analog input terminal 41 during a reset period at which the reset signal input terminal 50 is maintained at an active level (e.g., at a high level), and holds the sampled analog signal during a conversion period at which the reset input terminal 50 is maintained at an inactive level.

The successive approximation register 45 fetches therein the expected value, as an initial value, which is calculated by the digital computer 48 during the reset period. That initial code is input to the D/A converter 46 through the internal digital output terminal 45a and is converted into an analog signal Vda.

The sampled analog signal Vsh held by the sample-and-hold circuit 42 is input to the three-state comparator 43 together with the expected value Vda which has been converted into the analog signal by the D/A converter 46. The three-state comparator 43 compares the sampled analog signal Vsh with the expected value Vda so as to output one of higher state, lower state and coincidence.

Figure 10A:
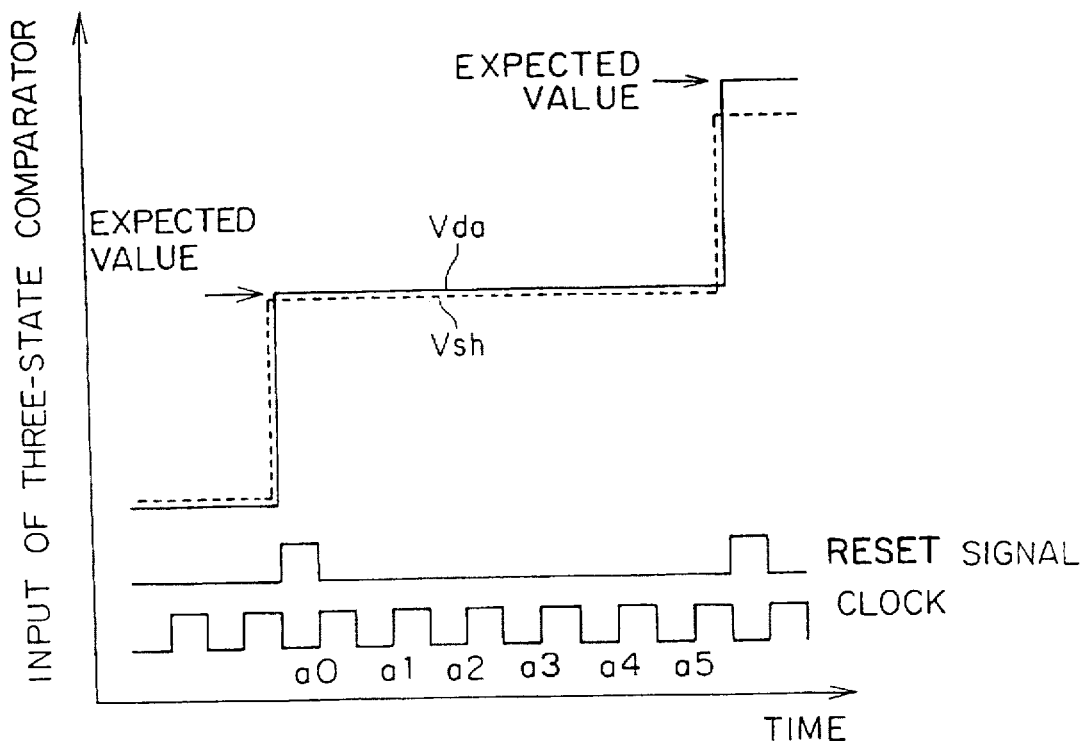
FIGS. 10A, 10B, 11A and 11B are time charts and diagrams for operation of the successive approximation A/D converter of FIG. 8.
Figure 10B:
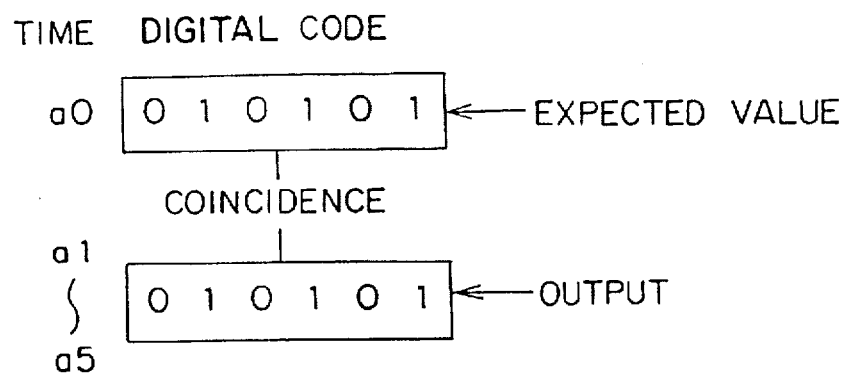

FIGS. 10A and 10B show the operation of the successive approximation A/D converter of FIG. 8 in the case where it has a 6-bit circuit configuration. If the sampled analog signal Vsh having a potential equivalent to (010101) coincides with the expected value Vda obtained by the D/A conversion, the second output 43b of the three-state comparator 43 becomes an active level, and the operations of both the successive approximation register 45 and the D/A converter 46 are stopped until the next reset signal is supplied. Further, the expected value (010101) is directly output from the successive approximation register 45 as a final digital output to both the frame memory 47 and the external output terminal 51. The expected value for each conversion cycle is provided by the digital computer 48 estimating the input analog value for the each conversion cycle.

When the sampled analog signal Vsh does not coincide with the expected value Vda obtained by the D/A conversion, the successive approximation register 45 allows the control circuit 44 to reset the lower M bits among the N bits (M<N) of the successive approximation register 45. The value M is constant for every conversion cycle or determined by the digital computer.

In a manner similar to that in the conventional successive approximation A/D converter, the sequence of "rewriting of the register data", "D/A conversion" and "comparison" is repeated M times from the M-th bit toward the LSB, thereby converging the digital code into the potential of the input analog signal. After the three-state comparator 43 detects the "coincidence" to provide an active level through the second output 43b, the digital code of the successive approximation register 45 is output to both the frame memory 47 and the external output terminal 51.

Figure 11A:
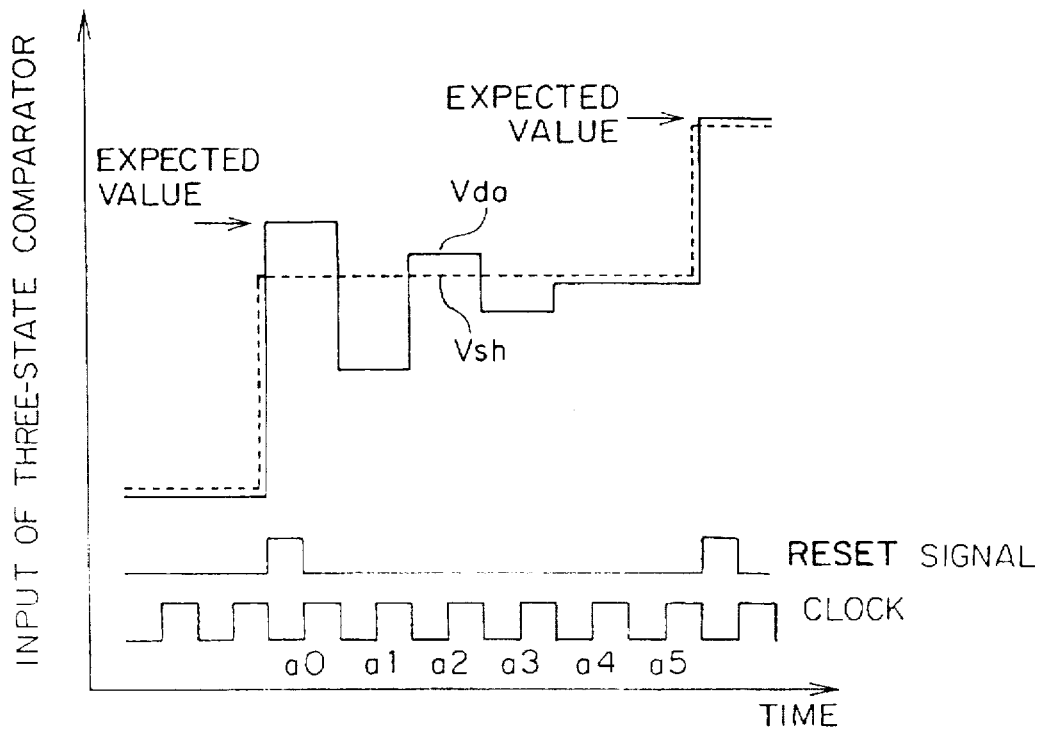
Figure 11B:
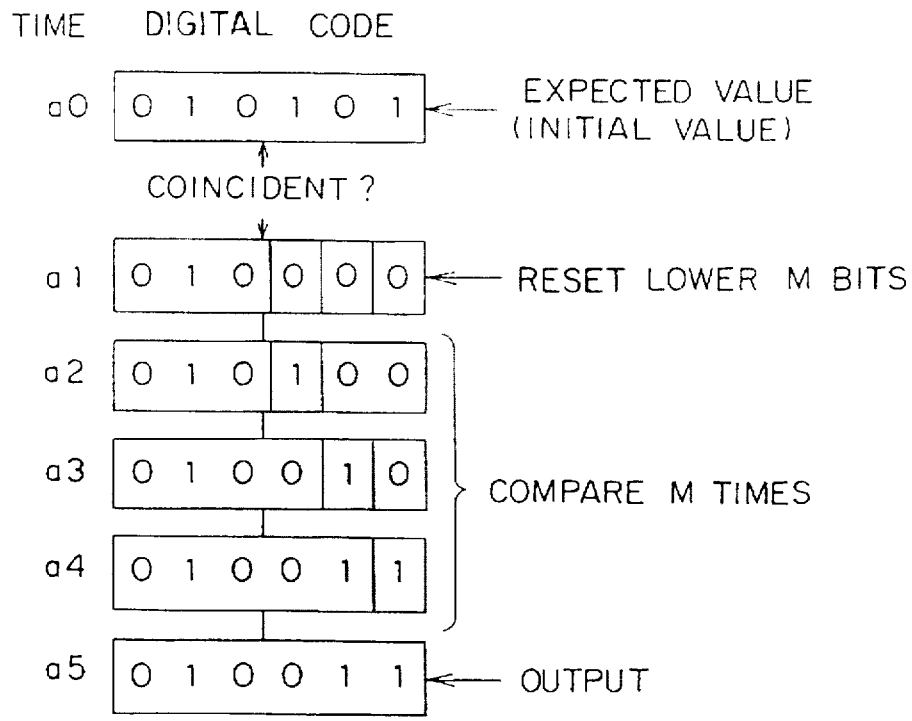

FIGS. 11A and 11B show the operation of the successive approximation A/D converter of FIG. 8 in another conversion cycle. After the digital code "01010" is supplied as an expected value or initial code to the successive approximation register 45 by the digital computer 48 and it is judged in the comparator 43 that the expected value does not coincide with the input signal level Vsh, the lower 3 bits of the successive approximation register 45 are reset, and after the D/A conversion has been carried out by 3 times, the digital code "010011" is obtained.

The frame memory 47 stores the digital code output through the external digital output terminal 45b of the successive approximation register 45. The digital computer 48 calculates an expected value for the next analog input signal on the basis of the digital code obtained in the prior A/D conversion cycle and stored in the frame memory 47, and outputs the resultant expected value to the successive approximation register 45 as an initial code. In the present embodiment, the circuit shown in FIG. 7 can be used as the three-state comparator 43 as in the first embodiment.

In the first and second embodiments, when a sound signal, for example, having a low frequency band is supplied as an input analog signal, the digital computers 8 and 48, which calculate an expected value, differentiate past data with respect to time so as to obtain the expected value. The digital computers may include various signal processors for estimating current data on the basis of the sampled data up to the previous conversion cycle.

Alternatively, when an image signal is supplied as an input analog signal, the following procedure may be adopted.

The image signal is first divided into a static image component and a dynamic image component. For the static image component, prior data (e.g., data at a time one frame prior to the present time instant) are used as it is. For the dynamic image component, data are obtained by calculating the motion vector of the dynamic object. Thereafter, the data of the static image component are superposed on the data of the dynamic image component so as to obtain the expected values of all the pixels.

In particular, in a static image or in an image including small part of the dynamic image, data at a time one frame prior to the present time is read out from the frame memory 47, and is supplied, as an initial value, to the up-down counter or the successive approximation register as it is or after being subjected to a desired calculation by a signal processor. In this case, the probability that the initial value coincide with the sampled analog signal increases. Accordingly, the number of the D/A conversion and comparison operations can be reduced for power saving.

Although the present invention has been described in detail with respect to the preferred embodiments, it should be construed that the present invention is not limited to the embodiments as described above, and the present invention encompasses variations and modifications made based on the spirit of the invention.

For example, the A/D converter of the present invention can be applied to A/D converters for use in various industrial instrumentation as well as in sound processing and image processing. In addition, in the tracking A/D converter, for example, the step of changes in the output of the D/A converter is not limited to an amount corresponding to the LSB, and hence the present invention can also be applied to D/A converters in which the output is varied adaptively.

What is claimed is:

1. An A/D converter comprising a sample-and-hold circuit for sampling-and-holding an analog input signal to generate a first signal for each conversion cycle, a comparator for periodically comparing said first signal with a sequence of second signals to thereby generate a sequence of result signals, a code generator for outputting a sequence of digital codes dependent on corresponding one of said result signals, said digital codes including an initial code and a final code during said each conversion cycle, a D/A converter for periodically converting said sequence of digital codes into a corresponding sequence of analog signals, said D/A converter supplying said corresponding sequence of analog signals as said sequence of second signals, an output section for outputting said final code as a final output of said A/D converter, a memory section for storing therein said final code for said each conversion cycle, and a control section for supplying said initial code to said code generator based on a final code of at least one previous conversion cycle stored in said memory section.

2. An A/D converter as defined in claim 1 wherein each of said result signals includes one of a higher state, a lower state and an equal state of said first signal with respect to a corresponding one of said second signals, and said code generator holds a previous digital code during said each conversion cycle after said equal state is generated.

3. An A/D converter as defined in claim 2 said D/A converter and comparator stop operation thereof during said each conversion cycle after said equal state is generated.

4. An A/D converter as defined in claim 1 wherein said initial code is equal to said final code of said previous conversion cycle.

5. An A/D converter as defined in claim 1 wherein said code generator is implemented by an up-down counter.

6. An A/D converter as defined in claim 1 wherein said code generator is implemented by a register.

7. An A/D converter as defined in claim 6 wherein if said higher state or a lower state is generated for said initial code, said register resets a predetermined number of lower bits of said initial code and generates a sequence of digital codes different from each other in said lower bits.

8. An A/D converter as defined in claim 1 further including a signal processor for calculating said initial code based on said final code of said at least one previous conversion cycle.

9. An A/D converter as defined in claim 1 wherein said memory section is implemented by a frame memory.

10. An A/D converter comprising a sample-and-hold circuit for sampling-and-holding an analog input signal to generate a first signal for each conversion cycle, a comparator for periodically comparing said first signal with a sequence of second signals to thereby generate a sequence of result signals, each of said result signals including one of a higher state, a lower state and an equal state of said first signal with respect to a corresponding one of said second signals, a code generator for outputting a sequence of digital codes dependent on corresponding one of said result signals, said digital codes including an initial code and a final code during said each conversion cycle, said code generator holding a previous digital code during said each conversion cycle after said equal state is generated, a D/A converter for periodically converting said sequence of digital codes into a corresponding sequence of analog signals, said D/A converter supplying said corresponding sequence of analog signals as said sequence of second signals, an output section for outputting said final code as a final output of said A/D converter.

11. An A/D converter as defined in claim 10 further including a memory section for storing therein said last code of each conversion cycle, and a control section for supplying said initial code to said code generator based on a final code of said at least one previous conversion cycle stored in said memory section.

12. An A/D converter as defined in claim 11 further including a signal processor for calculating said initial code based on said final code of said at least one previous conversion cycle.

13. An A/D converter as defined in claim 11 wherein said initial code is equal to said final code of said previous conversion cycle.

14. An A/D converter as defined in claim 10 wherein said memory section is implemented by a frame memory.

15. An A/D converter as defined in claim 10 said D/A converter and comparator stop operation thereof after said equal state is generated.

16. An A/D converter as defined in claim 10 wherein said code generator is implemented by an up-down counter.

17. An A/D converter as defined in claim 10 wherein said code generator is implemented by a register.

18. An A/D converter as defined in claim 10 wherein if a higher state or lower state is generated for said initial code, said register resets a predetermined number of lower bits of said initial code and generates a sequence of digital codes different from each other in said lower bits.

* * * * *